United States Patent [19]

Mens et al.

[11] Patent Number: 4,952,878
[45] Date of Patent: Aug. 28, 1990

[54] MAGNETIC RESONANCE APPARATUS HAVING AN IMPROVED RF COIL

[75] Inventors: Wilhelmus R. M. Mens; Peter H. Wardenier, both of Eindhoven, Netherlands

[73] Assignee: U.S. Philips Corporation, New York, N.Y.

[21] Appl. No.: 340,328

[22] Filed: Apr. 19, 1989

[30] Foreign Application Priority Data

Oct. 24, 1988 [NL] Netherlands .................... 8802608

[51] Int. Cl.$^5$ .................................... G01R 33/20
[52] U.S. Cl. .......................................... 324/322
[58] Field of Search .................... 324/318, 322, 307

[56] References Cited

U.S. PATENT DOCUMENTS

| | | | |
|---|---|---|---|
| 4,506,224 | 8/1982 | Krause | 324/319 |
| 4,672,972 | 6/1987 | Berke | 324/322 |
| 4,682,112 | 7/1987 | Beer | 324/32 |
| 4,686,473 | 7/1985 | Chesneau et al. | 324/320 |
| 4,712,067 | 12/1984 | Roschmann et al. | 324/318 |
| 4,737,718 | 4/1988 | Kemner et al. | 324/322 |
| 4,799,016 | 1/1989 | Rezvani | 324/318 |

FOREIGN PATENT DOCUMENTS 213665 11/1987 European Pat. Off. .
3616706 5/1986 Fed. Rep. of Germany .

*Primary Examiner*—Hezron E. Williams
*Assistant Examiner*—Kevin D. O'Shea
*Attorney, Agent, or Firm*—William Squire

[57] ABSTRACT

An r.f. transmitter coil is coupled to individually or group-wise independently drivable antenna wire elements, each independently drivable element being driven by its own power amplifier via a sliding contact. An r.f. supply source is coupled to the inputs of the power amplifiers via an input network which provides a phase distribution among the r.f. signals supplied to the amplifiers for the coil to transmit with a circularly polarized r.f. field.

15 Claims, 2 Drawing Sheets

MAGNETIC RESONANCE APPARATUS HAVING AN IMPROVED RF COIL

BACKGROUND OF THE INVENTION

1. Field of the Invention

The invention relates to a magnetic resonance apparatus having a magnet system for generating a stationary magnetic field, a gradient magnet system and an rf coil system.

2. Prior Art

Such a magnetic resonance apparatus is known from EP 213665 corresponding to U.S. Pat. No. 4,737,718. The apparatus described in said Specification comprises a bird cage rf coil which is built up from two ring conductors which are connected to a number of antenna wires which are mutually in parallel and with a symmetry axis. With a correct choice of impedances and reactances a spatial homogeneous rf field in the coil is generated with a standing closed cosine wave on the annular conductors.

U.S. Pat. No. 4,712,067 describes an rf coil which is built up from a number, for example two, of saddle-shaped coils by which, with an adapted mutual coupling and a correct drive, a spatial homogeneous rf field can be generated in a mode which is dependent on the drive and mutual orientation of the current conductors. In this case also current conductors which are mutually in parallel and with a symmetry axis constitute active antenna wires of the coil.

When using such coils in the described form as transmitter coils for generating magnetic resonant signals in an object to be examined, the drawback of a low flexibility in the drive occurs in that the rf field within the coil is actually impressed, apart from the strength, by the geometry of the coil. Interfering counter fields are also often generated which can be compensated for only by extra power supply.

SUMMARY OF THE INVENTION

It is the object of the invention to avoid these drawbacks and for that purpose a magnetic resonance apparatus of the type mentioned in the opening paragraph is characterized according to the invention in that the rf coil system comprises a coil which has means for an individually controllable drive of antenna wires or subgroups of aerial wires of the coil.

Since an rf coil according to the invention comprises independently drivable aerial wires a significantly greater extent of freedom in the field distribution is obtained and a significantly smaller excitation power often suffices.

In a preferred embodiment the rf coil comprises a number of straight conductors which are situated on a cylinder surface and extend in parallel with each other and with a cylinder axis and which are connected on each side via fixed capacities with a ring conductor and to which an rf source can be connected via a power amplifier. In particular, an input network having a resistor, a capacity and an inductance, is incorporated between the power amplifier and a supply line from the rf source. The resistor hereof is connected, for example, to a voltage source for adjusting a quiescent current, while a capacitor, for example, is connected to an electrically conductive screening cylinder which surrounds the coil and which may also be constructed as a heat dissipating element. The power amplifiers which are formed, for example, by a MOS-FET transistor may be connected thereto via a readily heat conducting contact.

In a further preferred embodiment an output of the power amplifiers is connected to the antenna wires via a preferably externally adjustable sliding contact. The impedance of the coil can be adapted to an object to be measured by means of the said sliding contacts.

In behalf of circularly polarized rf fields, a circuit is incorporated in a further preferred embodiment for adjusting a phase shift, for example, given by the number of antenna wires, between successive antenna wires of, for example, a bird cage coil as described in U.S. Pat. No. 4,737,718 of a transversal electromagnetic (TEM) coil as described in U.S. Pat. No. 4,712,067.

BRIEF DESCRIPTION OF THE DRAWING

A few preferred embodiments according to the invention will be described in greater detail hereinafter with reference to the accompanying drawing, in which.

DETAILED DESCRIPTION OF THE PREFERRED EMBODIMENTS

Figure 1:
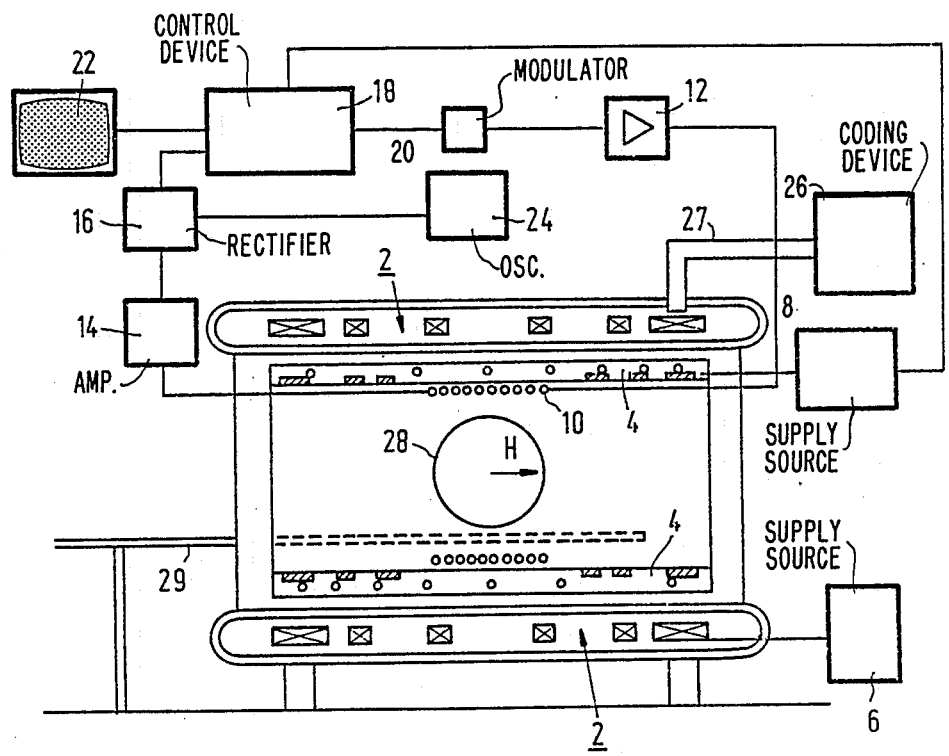
FIG. 1 shows a magnetic resonance apparatus comprising an rf transmitter coil according to the invention.

A magnetic resonance apparatus as shown in FIG. 1 comprises a magnet system 2 for generating a homogeneous stationary magnetic field H, a magnet system 4 for generating magnetic gradient fields, supply sources 6 and 8, for the magnet system 2 and the magnet system 4, respectively. A radio frequency magnet coil 10 serves to generate a radio frequency magnetic alternating field and for that purpose is connected to a radio frequency source comprising the output of r.f. amplifier 12. For the detection of nuclear spin resonance signals generated by the radio frequency transmitter field in an object to be examined the rf coil 10 may also be used which for that purpose is connected to a signal amplifier 14. Another coil, for example, a surface coil, may also be used for detection. The signal amplifier 14 is connected to a phase-sensitive rectifier 16 which is connected to a central control device 18. The central control device 18 further controls a modulator 20 which feeds r.f. amplifier 12, the supply source 8 for the gradient coils and a monitor 22 for display. A high-frequency oscillator 24 controls both the modulator 20 and the phase-sensitive rectifier 16 processing the measured signals. A cooling device 26 with cooling ducts 27 serves for the cooling, if any, of the magnet coils 2 for the main field. Such a cooling device can serve water cooling for resistance coils or liquid nitrogen and/or helium cooling for high field strength, superconductive magnet coils. The transmitter coil 10 placed within the magnet systems 2 and 4 encloses a measuring space 28 which in an apparatus for medical diagnostic measurements is wide enough to comprise a patient lying on a patient table 29. So a homogeneous magnetic field H, cross-sections of the object-selecting gradient fields and a spatial homogeneous radio frequency alternating field can be produced in the measuring space 28.

Figure 2:
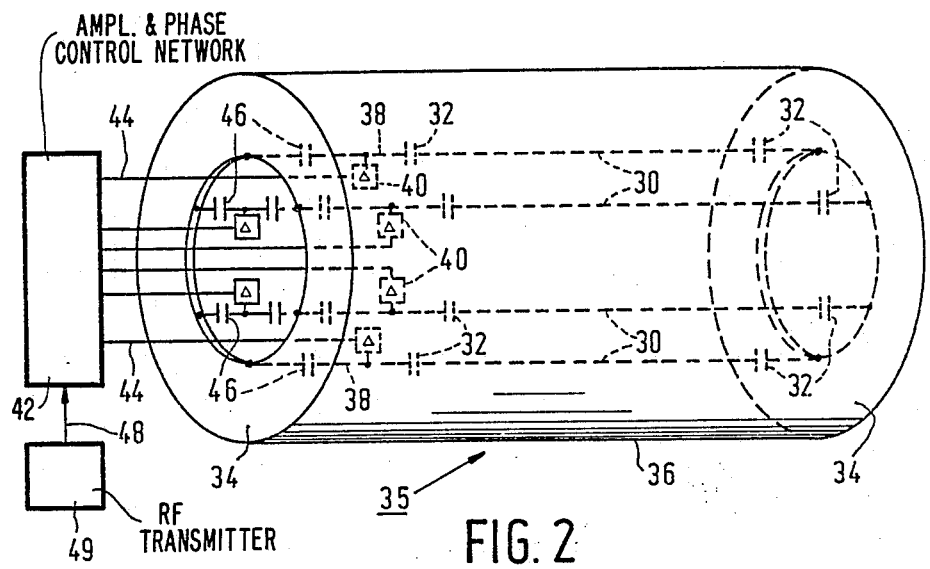
FIG. 2 shows an embodiment of such an rf coil.

An rf coil according to the invention as shown in FIG. 2, in this case in the form of a transversal electromagnetic coil as described in U.S. Pat. No. 4,712,067, comprises current conductors 30 which are connected to electric ring conductors 34 via capacitors 32. The ring conductors 34 in this case have the form of flanges forming part of a cylindrical housing 35 having a cylindrical surface 36 for screening the rf field to be generated by the coil from interference fields. In the embodiment shown the housing 35 also forms a ground potential electrode for the antenna wires and may also serve as a heat dissipatingg element. Antenna wire parts 38 are connected respectively, via power amplifiers 40 each of which comprises, for example, a MOS-FET transistor, to an amplitude and phase-controlling network 42 via preferably coaxial connection cables 44. Uncoupling capacitor 46 for uncoupling purposes are incorporated in the antenna wire parts 30'. In this manner each of the antenna wires can be energized individually by means of the control network 42; however, several antenna wires may also receive an equal supply. The supply for various antenna wires may also differ in phase only. The control network is supplied via a connection cable 48 from an rf transmitter 49 corresponding to the rf amplifier 12 output in FIG. 1.

Figure 3:
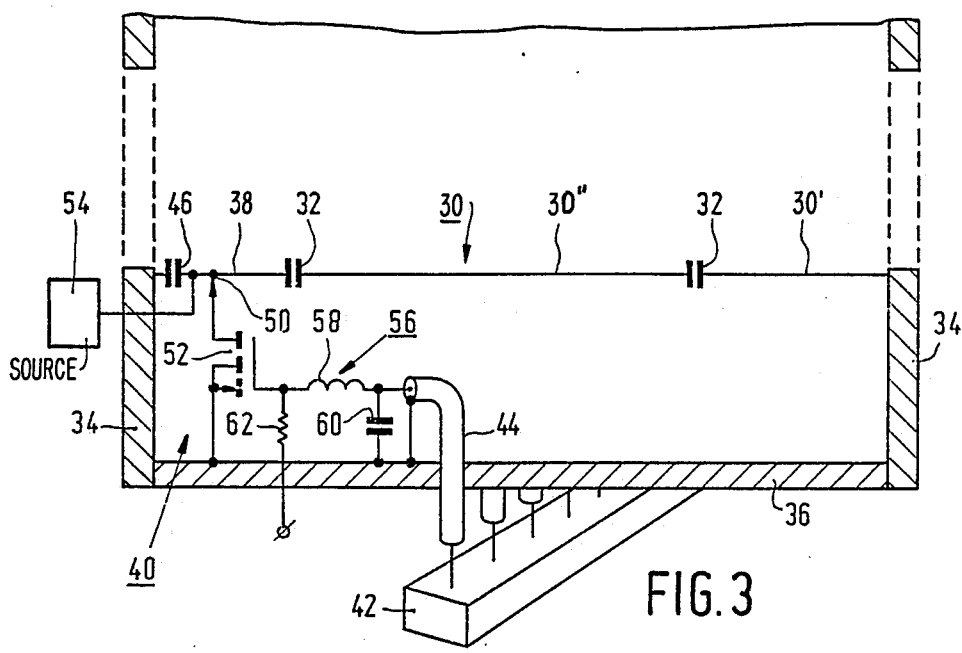
FIG. 3 shows a circuit diagram for driving such a coil for generating a circularly polarized rf pulse.

FIG. 3 shows in greater detail a part of a coil as shown in FIG. 2. An antenna wire 30 with a pair of spaced capacitors 32, a pair of spaced ring conductors and a part of cylinder housing surface 36 of the coil are shown. A power MOS-FET 52 is connected to a part 38 of the antenna wire 30 via a sliding contact 50. Antenna wire part 38 is coupled via a capacitor 32 to the antennal wire 30 part 30 and, via an uncoupling capacitor 46 to one of the conductors 34. The wire part 30'' is coupled to the other ring conductor 34 via a second capacitor 32.

A supply source 54 from which a fixed voltage of, for example, 50 V can be applied to the antenna wire is incorporated for a fixed supply for the antenna wire. The MOS-FET transistor 52 is connected, via an input network 56 which comprises a coil 58 and a capacitor 60, to the amplitude and phase correcting network 42 via a supply line 44 which may, for example, comprise a coaxial cable. A quiescent current can be applied to the transistor 52 via a resistor 62.

Figure 4:
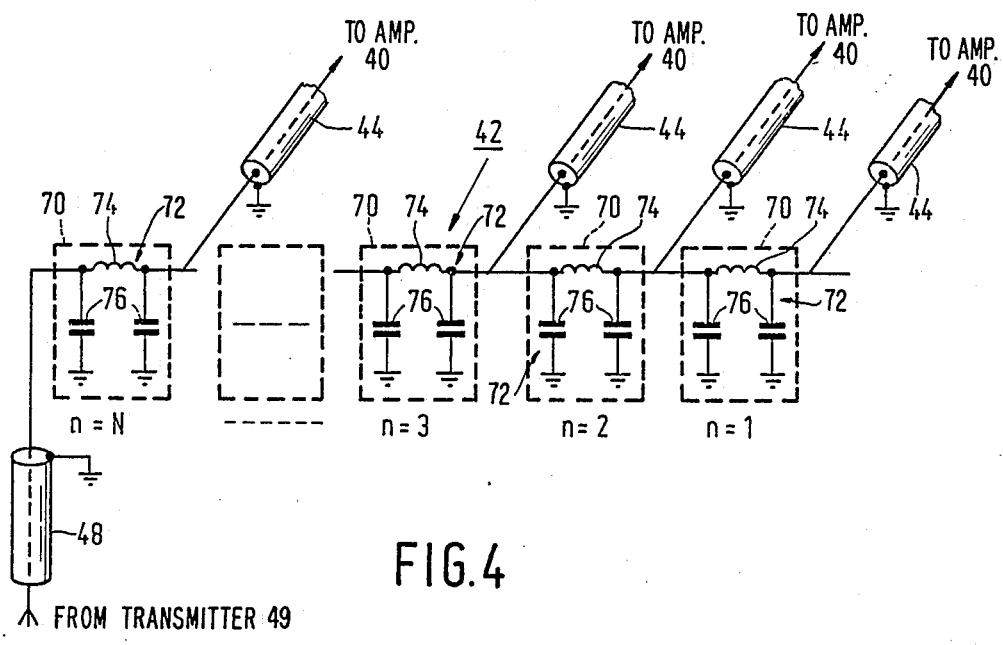
FIG. 4 shows an example of an amplitude and phase correcting network therefore.

FIG. 4 shows an example of an amplitude and phase correcting network 42. This is connected to amplifiers 40 as shown in FIG. 2 via the lines 44 and may be fed from the rf transmitter 49 via the coaxial cable 48.

The network 42 comprises N sections 70 each having an L-C circuit 72 built up from an inductance 74 and two capacities 76. The number of sections equals the number of antenna wires or groups of antenna wires to be controlled individually and in practical cases is, for example, 6 to 12. For generating a circularly polarized rf field the amplitude to be applied to each of the coil wires is equal but for each of the wires mutually shifted in phase so that the amplitude wave hence rotates with the desired frequency over the antenna wires of the coil.

We claim:

1. A magnetic resonance apparatus having a magnet system for generating a stationary magnetic field, a gradient magnet system and an rf coil system, characterized in that the rf coil system comprises a coil which has means for an individually controllable drive of antenna wires or sub-groups of antenna wires of the coil and a power amplifier incorporated for each of the individually drivable antenna wires in the proximity of the corresponding antenna wire.

2. A magnetic resonance apparatus as claimed in claim 1, characterized in that the power amplifier comprises a MOS-FET transistor which is connected, via an input network having an inductance and a capacitance, to an rf supply source.

3. A magnetic resonance apparatus as claimed in claim 1, characterized in that the rf coil comprises a number of antenna wires present on a cylinder surface about a central axis which are connected to ring conductors on each side via a capacitance.

4. A magnetic resonance apparatus as claimed in claim 3, characterized in that the ring conductors are constructed as flanges adapted to the cylinder.

5. A magnetic resonance apparatus as claimed in claim 1, characterized in that the rf coil is enclosed radially by an electrically conductive screening sheath.

6. A magnetic resonance apparatus as claimed in claim 5, characterized in that the sheath serves as a reference potential for circuit elements of input networks and/or as a heat dissipating element for the power amplifiers.

7. A magnetic resonance apparatus as claimed in claim 1, characterized in that the power amplifiers are connected to the corresponding antenna wires via axially adjustable contacts.

8. A magnetic resonance apparatus as claimed in claim 1, characterized in that a phase control device is incorporated in the supply for the individually drivable antenna wires for driving with successive phase differences a signal in the antenna wires for generating a circularly polarized rf transmitter field.

9. A magnetic resonance apparatus as claimed in claim 2, characterized in that the rf coil comprises a number of antenna wires present on a cylinder surface about a central axis which are connected to ring conductors on each side via a capacitance.

10. A magnetic resonance apparatus as claimed in claim 2, characterized in that the rf coil is enclosed radially by an electrically conductive screening sheath.

11. A magnetic resonance apparatus as claimed in claim 3, characterized in that the rf coil is enclosed radially by an electrically conductive screening sheath.

12. A magnetic resonance apparatus as claimed in claim 4, characterized in that the rf coil is enclosed radially by an electrically conductive screening sheath.

13. A magnetic resonance apparatus as claimed in claim 2, characterized in that the power amplifiers are connected to antenna wires via axially adjustable contacts.

14. A magnetic resonance apparatus as claimed in claim 3, characterized in that the power amplifiers are connected to antenna wires via axially adjustable contacts.

15. A magnetic resonance apparatus as claimed in claim 5, characterized in that a phase control device is incorporated in the supply for the individually drivable antenna wires for driving with successive phase differences a signal in the antenna wires for generating a circularly polarized rf transmitter field.

* * * * *